: US006948898B2

United States Patent
Berger et al.

(10) Patent No.: US 6,948,898 B2
(45) Date of Patent: Sep. 27, 2005

(54) ALIGNMENT OF SEMICONDUCTOR WAFERS AND OTHER ARTICLES

(75) Inventors: Alexander J. Berger, Palo Alto, CA (US); Frank E. Kretz, Santa Clara, CA (US)

(73) Assignee: Tru-Si Technologies, Inc., Sunnyvale, CA (US)

(*) Notice: Subject to any disclaimer, the term of this patent is extended or adjusted under 35 U.S.C. 154(b) by 157 days.

(21) Appl. No.: 10/272,257

(22) Filed: Oct. 15, 2002

(65) Prior Publication Data

US 2003/0031549 A1 Feb. 13, 2003

Related U.S. Application Data

(62) Division of application No. 09/905,218, filed on Jul. 13, 2001.

(51) Int. Cl.[7] .............................................. B65G 49/07
(52) U.S. Cl. .................. 414/222.04; 414/783; 414/963; 294/64.3
(58) Field of Search .................. 414/222.04, 222.05, 414/754, 757, 783, 936, 941; 294/64.1, 64.2, 64.3

(56) References Cited

U.S. PATENT DOCUMENTS

| | | | |
|---|---|---|---|
| 3,438,668 A | 4/1969 | Olsson et al. ............... 294/64.3 |
| 3,945,505 A | 3/1976 | Frisbie et al. |
| 4,009,785 A | 3/1977 | Trayes ......................... 414/676 |
| 4,029,351 A | 6/1977 | Apgar et al. ................... 294/64 |
| 4,566,726 A | 1/1986 | Correnti et al. ............ 294/64.3 |
| 4,773,687 A | 9/1988 | Bush et al. ................. 294/64.1 |
| 5,004,399 A | 4/1991 | Sullivan et al. .............. 414/729 |
| 5,044,752 A | 9/1991 | Thurfjell et al. ............. 356/400 |
| 5,080,549 A * | 1/1992 | Goodwin et al. ......... 414/744.8 |
| 5,102,291 A | 4/1992 | Hine ........................... 414/816 |
| 5,169,196 A | 12/1992 | Safabakhsh ................. 294/64.3 |
| 5,375,291 A | 12/1994 | Tateyama et al. ............. 15/302 |
| 5,445,486 A | 8/1995 | Kitayama et al. ........... 414/937 |
| 5,452,078 A | 9/1995 | Cheng ......................... 356/150 |
| 5,456,179 A | 10/1995 | Lamelot ...................... 102/213 |
| 5,540,098 A | 7/1996 | Ohsawa ....................... 73/629 |
| 5,546,179 A | 8/1996 | Cheng .......................... 356/73 |
| 5,556,147 A | 9/1996 | Somekh et al. ............. 294/64.1 |
| 5,622,400 A | 4/1997 | George ....................... 294/64.1 |
| 5,647,626 A | 7/1997 | Chen et al. ................. 294/87.1 |
| 5,669,752 A | 9/1997 | Moon .......................... 414/783 |
| 5,746,460 A | 5/1998 | Marohl et al. ............... 294/1.1 |
| 5,765,889 A | 6/1998 | Nam et al. .................. 294/64.1 |
| 5,851,102 A * | 12/1998 | Okawa et al. ............... 414/783 |
| 5,863,170 A | 1/1999 | Boitnott et al. .............. 414/222 |
| 5,870,488 A | 2/1999 | Rush et al. .................. 382/151 |
| 5,967,578 A | 10/1999 | Frey ........................... 294/64.3 |
| 6,013,920 A | 1/2000 | Gordon et al. ........... 250/559.36 |
| 6,095,582 A | 8/2000 | Siniaguine et al. ......... 294/64.3 |
| 6,099,056 A | 8/2000 | Siniaguine et al. ......... 294/64.3 |
| 6,109,677 A | 8/2000 | Anthony ................... 294/103.1 |
| 6,113,165 A | 9/2000 | Wen et al. .................... 294/1.1 |
| 6,139,678 A | 10/2000 | Siniaguine ................... 156/345 |
| 6,164,894 A | 12/2000 | Cheng ......................... 414/941 |
| 6,168,697 B1 | 1/2001 | Siniaguine et al. ..... 204/298.15 |
| 6,174,011 B1 | 1/2001 | Keigler ....................... 294/99.1 |
| 6,176,023 B1 | 1/2001 | Doche ......................... 34/451 |
| 6,183,026 B1 | 2/2001 | Cai et al. .................... 294/64.1 |

(Continued)

FOREIGN PATENT DOCUMENTS

| | | | |
|---|---|---|---|
| EP | 1 068 936 A1 | 1/2001 | |
| FR | 2 778 496 | 11/1999 | |
| JP | 61254437 A * | 11/1986 | ............ B65H/3/14 |
| JP | 09-115990 | 5/1997 | |

*Primary Examiner*—Kathy Matecki
*Assistant Examiner*—Mark A. Deuble
(74) *Attorney, Agent, or Firm*—MacPherson Kwok Chen & Heid LLP; Michael Shenker

(57) ABSTRACT

A wafer or some other article is aligned while being held by an end-effector.

22 Claims, 7 Drawing Sheets

U.S. PATENT DOCUMENTS

| | | |
|---|---|---|
| 6,183,183 B1 | 2/2001 | Goodwin et al. ............ 414/941 |
| 6,184,060 B1 | 2/2001 | Siniaguine ................. 438/106 |
| 6,187,103 B1 | 2/2001 | Huang et al. ............... 118/728 |
| 6,198,976 B1 | 3/2001 | Sundar et al. ................ 700/59 |
| 6,199,927 B1 | 3/2001 | Shamlou et al. ........... 294/64.1 |
| 6,202,482 B1 | 3/2001 | Blew et al. ................... 73/159 |
| 6,206,441 B1 | 3/2001 | Wen et al. ................... 296/1.1 |
| 6,217,034 B1 | 4/2001 | Smedt et al. ............... 279/106 |
| 6,220,808 B1 | 4/2001 | Bonora et al. .............. 414/940 |
| 6,244,641 B1 | 6/2001 | Matzat et al. ............... 294/64.1 |
| 6,427,991 B1 | 8/2002 | Kao ............................. 269/21 |
| 6,435,807 B1 | 8/2002 | Todorov et al. ............ 414/757 |
| 6,468,022 B1 | 10/2002 | Whitcomb ................... 414/757 |
| 6,631,935 B1 | 10/2003 | Casarotti et al. ........... 294/64.1 |
| 6,638,004 B2 | 10/2003 | Berger et al. ............... 414/800 |
| 2002/0113321 A1 | 8/2002 | Siniaguine ................. 257/782 |
| 2003/0173790 A1 | 9/2003 | Hartog ...................... 294/64.1 |

* cited by examiner

US 6,948,898 B2

ALIGNMENT OF SEMICONDUCTOR WAFERS AND OTHER ARTICLES

CROSS REFERENCE TO RELATED APPLICATIONS

The present application is a division of U.S. patent application Ser. No. 09/905,218 filed Jul. 13, 2001, incorporated herein by reference.

BACKGROUND OF THE INVENTION

The present invention relates to alignment of semiconductor wafers and other articles.

Fabrication of integrated circuits from a semiconductor wafer involves many processing steps, and the wafer may have to be aligned as it goes from one step to the next. For example, before a wafer is diced, it has to be attached to an adhesive film stretched over a frame, which requires accurate alignment of the wafer to the frame. Alignment is performed using a piece of equipment called aligner. A robot picks up the wafer and places it on the aligner. The aligner adjusts the position of the wafer in the horizontal plane to cause the center of the wafer to occupy a predetermined position. Then the aligner rotates the wafer to place the wafer into some predetermined rotational orientation, i.e. with some feature (a notch or a flat) on the wafer's circumference in a predetermined position. Then the robot picks up the wafer again and carries the wafer to a target station for the next processing step.

SUMMARY

Some embodiments of the present invention eliminate the need to use an aligner. The wafer is aligned while held by the robot. The wafer processing becomes faster and more economical, and throughput is increased. Also, the wafer damage is reduced due to elimination of the wafer transfer to and from the aligner. In addition, the wafer position is more precise at the target station because the positioning errors involved in the robot picking up the wafer from the aligner are eliminated.

The invention is not limited by the embodiments and advantages described above, but is defined by the appended claims.

DESCRIPTION OF PREFERRED EMBODIMENTS

Figure 1:
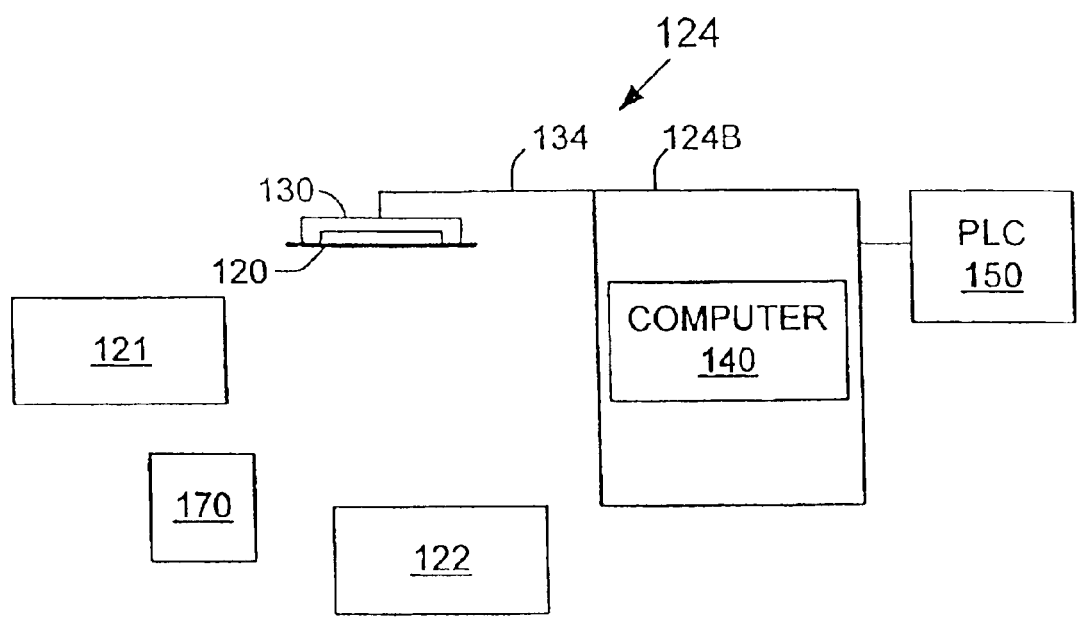
FIG. 1 is a block diagram illustrating a wafer processing system according to one embodiment of the present invention.

In FIG. 1, a semiconductor wafer 120 is being transported from a station 121 to a station 122 by a robot 124. The wafer is being held by the robot's end effector 130 attached to the robot's arm 134. Arm 134 is attached to a robot body 124B which itself may include a number of moving arms. In one example, end effector 130 is attached to a robot of type GBY7S available from Genmark Automation of Sunnyvale, Calif. The robot is controlled by its computer 140, which in turn may receive commands from, and send information to, a programmable logic controller (PLC) 150. Computer 140 and PLC 150 are controlled by software of the present invention. The invention is not limited to any particular robot or robot control mechanism.

Stations 121, 122 can be any stations involved in wafer storage or processing. Examples include wafer storage cassettes, horizontal wafer shipment containers ("pods"), etch and deposition equipment, film frame machines that attach adhesive film frames to wafers, dicing equipment. Before the wafer is placed on station 122, it is aligned at station 170. Alignment involves adjusting the XY position and the rotational orientation of the wafer relative to end effector 130. See e.g. the following U.S. Pat. Nos. 6,164,894; 5,456,179; 5,452,078. The wafer is aligned in end effector 130. Alignment station 170 does not need a wafer holder or a platform to hold the wafer. The end effector does not need to release the wafer to perform the alignment.

Figure 2:
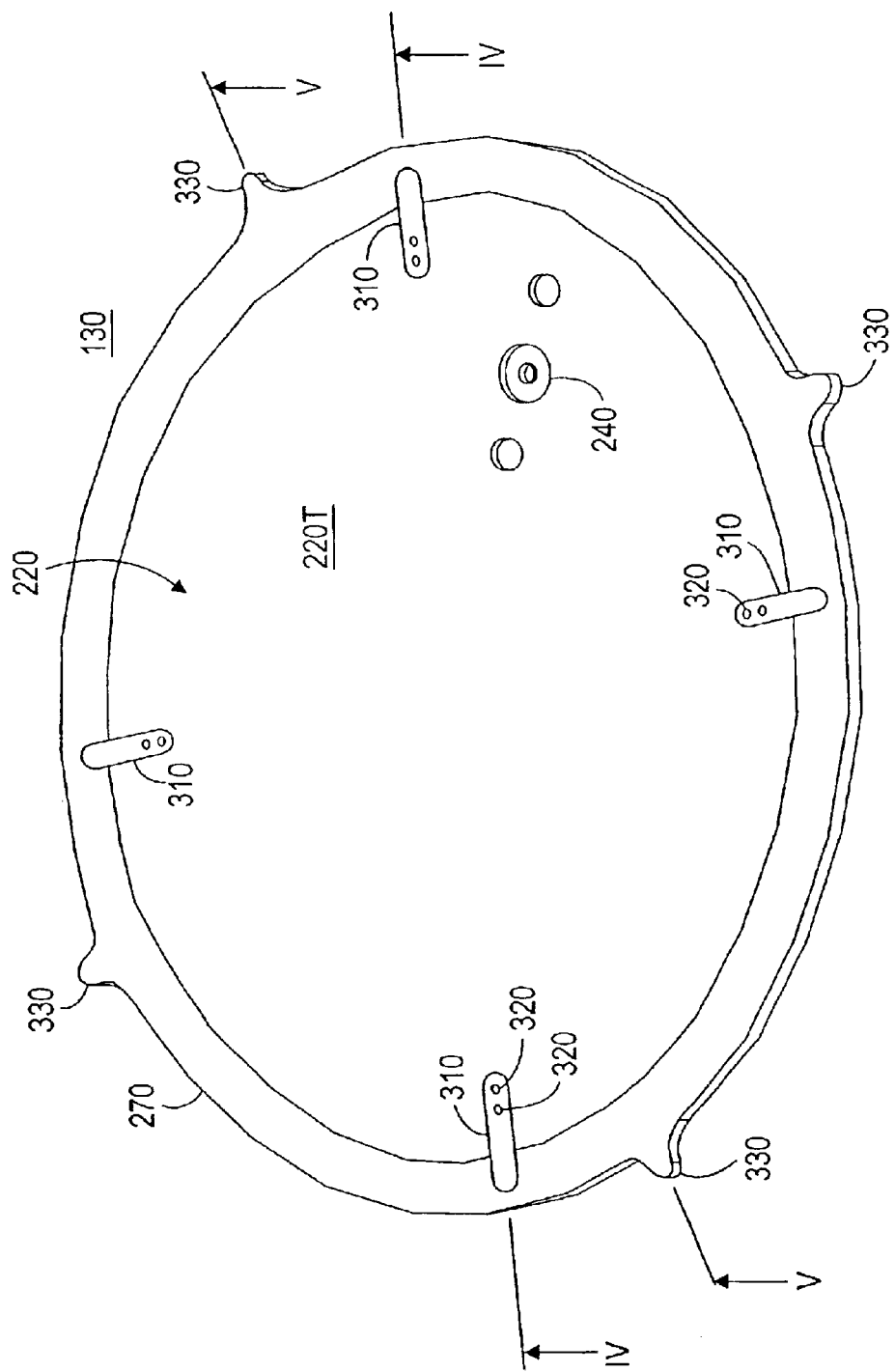
FIGS. 2, 3 are perspective views of a robot's end effector according to one embodiment of the present invention.
Figure 3:
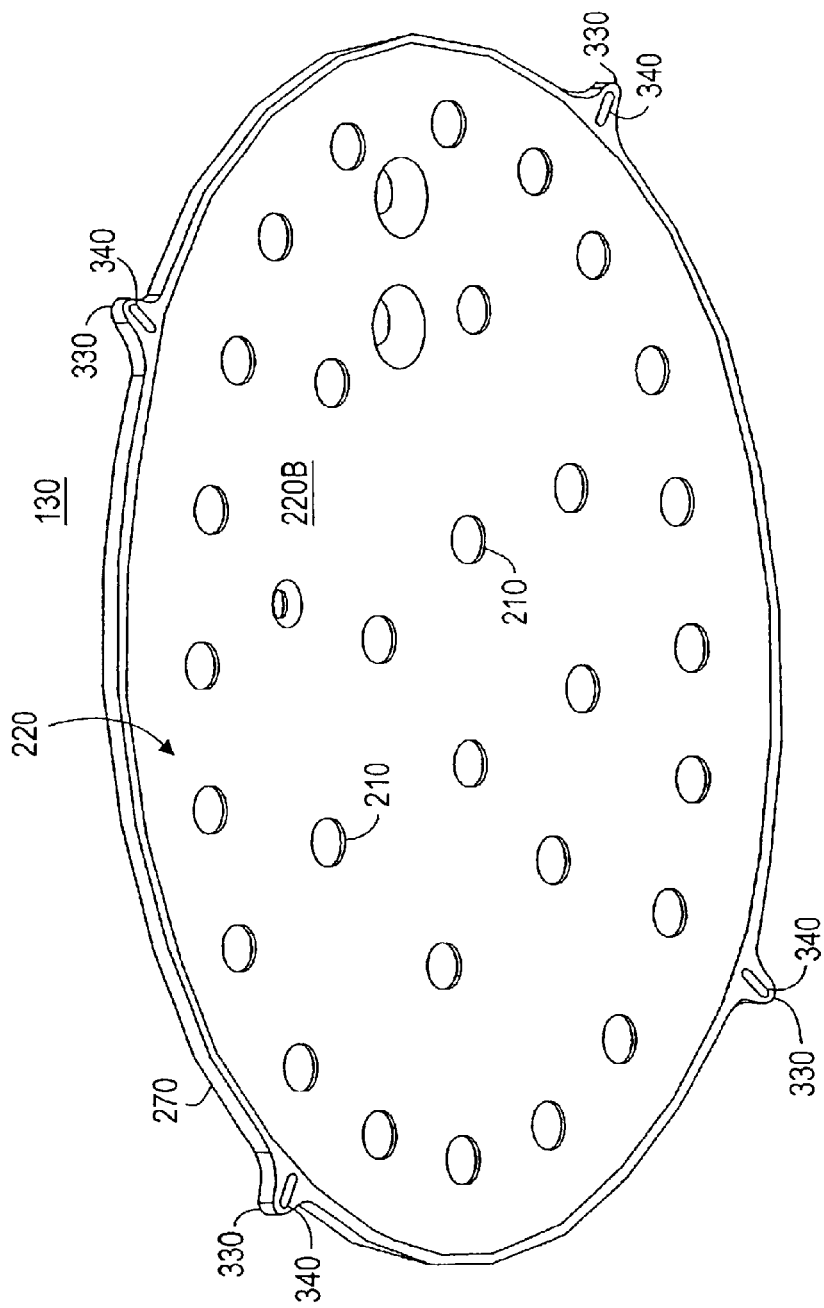
Figure 4:
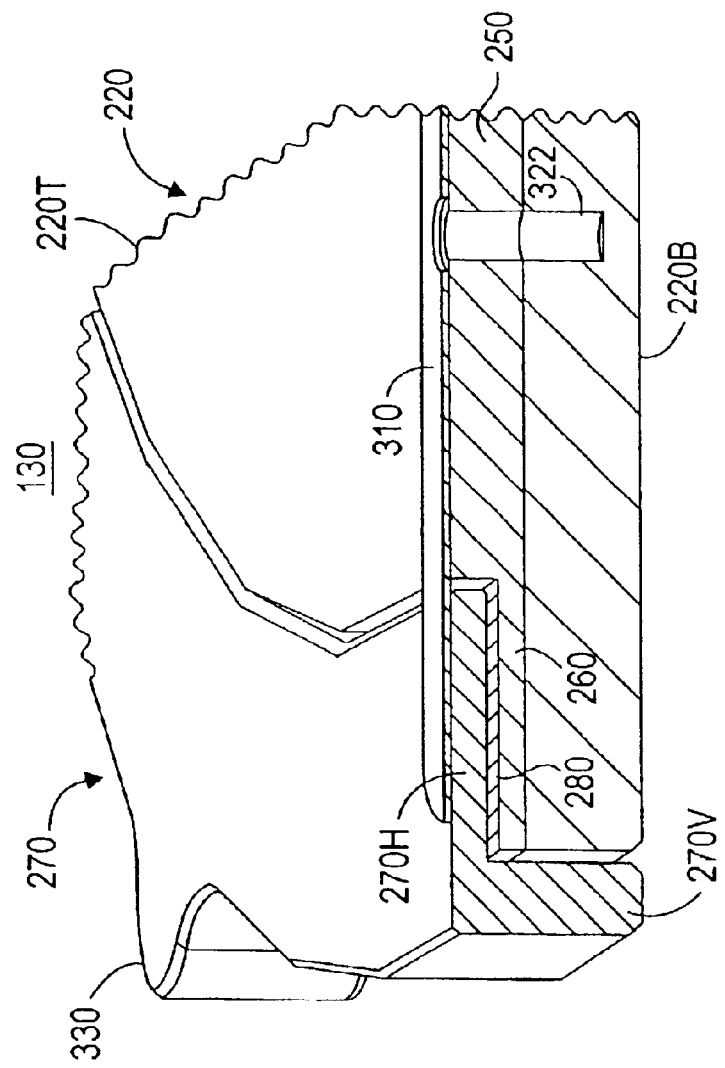
FIG. 4 is a perspective and cross sectional view of a portion of the end effector of FIGS. 2, 3.
Figure 5:
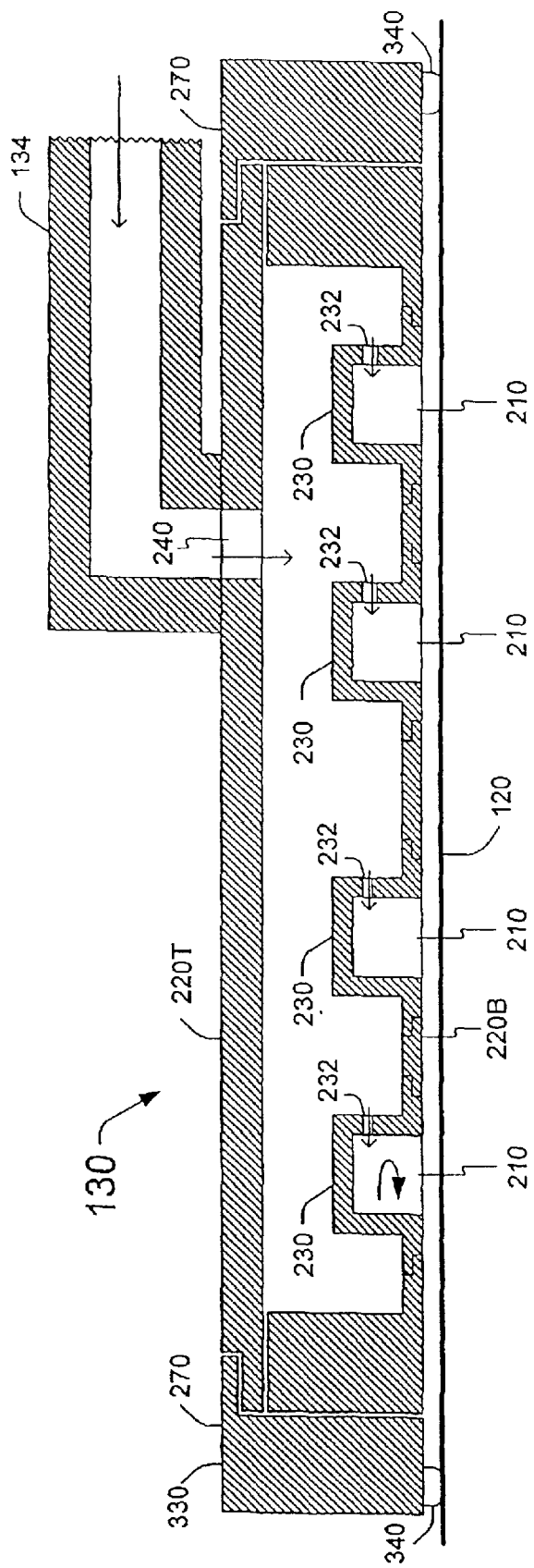
FIG. 5 is a cross sectional view of the end effector of FIGS. 2, 3.

FIG. 2 is a perspective view showing a top and a side of one embodiment of end effector 130. FIG. 3 shows the same side and the bottom. FIG. 4 shows a vertical cross section of a portion of the end effector along a line IV—IV in FIG. 2. FIG. 5 shows how a vertical cross-section might look along a line V—V in FIG. 2 (FIG. 5 is not an accurate representation of some features as noted below). FIGS. 6–10 illustrate a wafer alignment operation at station 170.

In the embodiment of FIGS. 2–5, the end effector is a non-contact type. It holds the wafer with gas vortices emitted from openings 210 (FIGS. 3, 5) in its flat bottom surface. Only a few of the openings are labeled in the drawings. Gas vortex end effectors are described in U.S. Pat. No. 6,095,582 issued Aug. 1, 2000 to Siniaguine et al. and incorporated herein by reference. See also U.S. patent application Ser. No. 09/632,236 filed Aug. 4, 2000 by S. Casarotti et al.; U.S. patent application Ser. No. 09/633,086 filed Aug. 4, 2000 by S. Kao; U.S. patent application Ser. No. 09/877,366 entitled "Article Holders that Use Gas Vortices to Hold an Article in a Desired Position", filed Jun. 8, 2001 by S. Kao. The end effector of FIGS. 2–5 has a body 220 made of a top plate 220T and a bottom plate 220B. A number of vortex chucks 230 (FIG. 5) are positioned in a hollow region between the two plates. Each opening 210 is an opening of one such chuck. (FIG. 5 does not accurately represent the chucks' position.) A tangential passage 232 in the chuck's cylindrical sidewall enters the chuck tangentially to the sidewall. Gas supplied under pressure through a passage in arm 134 and an opening 240 enters the chucks through passages 232. The chucks' sidewalls shape the gas flow in each chuck into a vortex. The vortices exit through openings 210 and create an attraction force that draws the wafer towards the body 220. At the same time, the gas creates a cushion that prevents the wafer from touching the body 220.

Top plate 220T has a central portion 250 (FIG. 4) and a peripheral portion 260. Peripheral portion 260 extends sidewise from the bottom of central portion 250 and forms a horizontal shelf surrounding the central portion 250. A ring 270 rotates around the end effector's body 220. Ring 270 has a horizontal portion 270H which slides over the shelf 260. Teflon strip or strips 280 (FIG. 4) are attached to the top surface of shelf 260 and/or the bottom surface of the ring's horizontal portion 270H to reduce friction between the ring 270 and the shelf 260. Vertical portion 270V of ring 270 surrounds the end effector body 220.

Spring steel plates 310 are attached to the top surface of central portion 250 with bolts 320 (FIG. 2). Bolts 320 are inserted into holes 322 (FIG. 4) each of which passes through central portion 250 and terminates inside bottom plate 220B. Each plate 310 physically contacts the top surface of the ring's horizontal portion 270H. The friction between plates 310 and the ring's horizontal portion 270H prevents the ring from rotating uncontrollably around body 220 but allows the ring to be rotated at alignment station 170.

Ring 270 has outward protrusions 330. A pad 340 (FIGS. 3, 5) is attached to the bottom surface of each outward protrusion. Wafer 120 is pressed against these pads 340 when drawn to the end effector by the gas vortices or other forces (depending on the type of the end effector). The friction between the pads and the wafer prevents the wafer from unintentionally sliding horizontally relative to the end effector. This friction also causes the wafer to rotate when the ring 270 is rotationally driven at alignment station 170.

Figure 6:
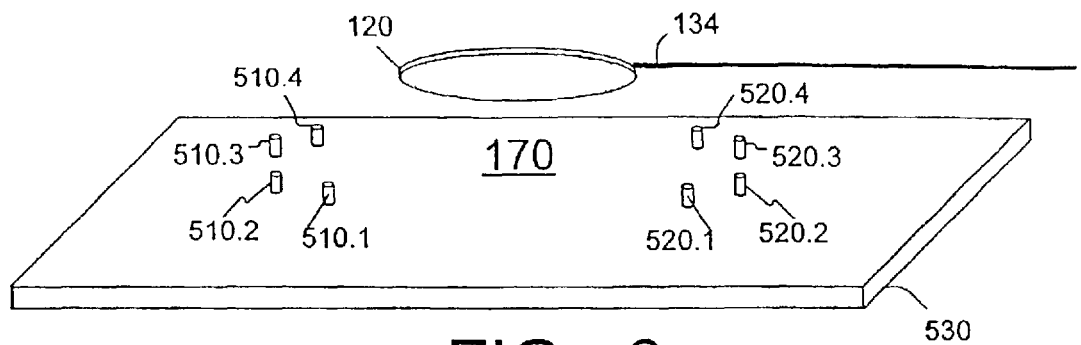
FIG. 6 is a perspective view illustrating an alignment operation according to one embodiment of the present invention.
Figure 7:
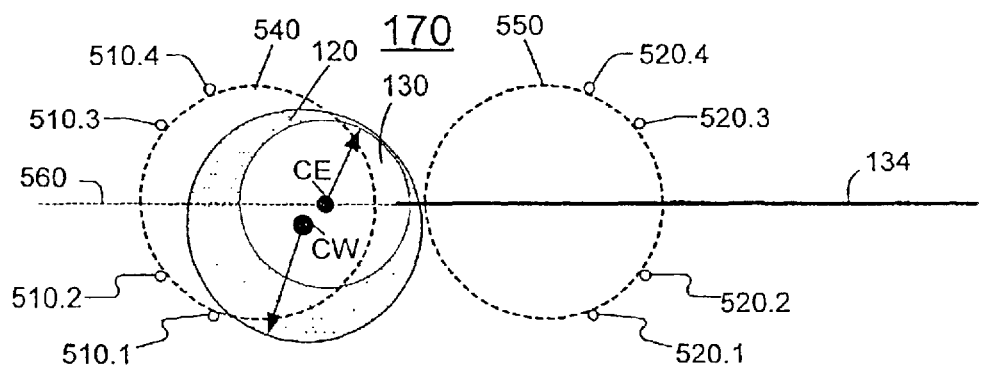
FIGS. 7–9 are top views illustrating an alignment operation according to one embodiment of the present invention.
Figure 8:
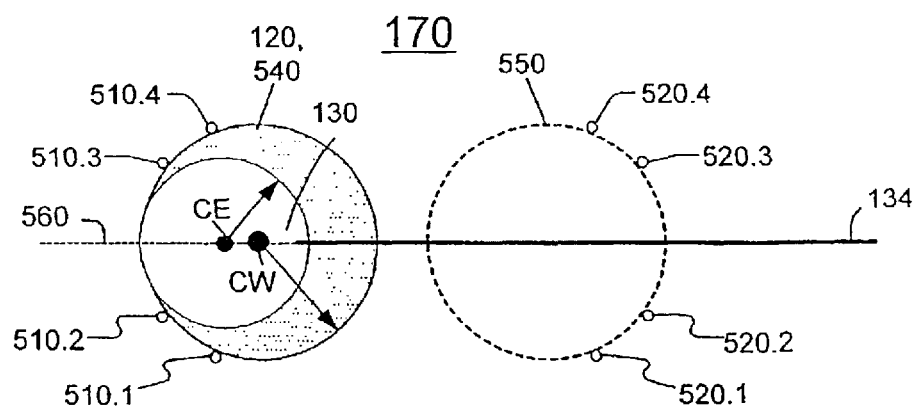
Figure 9:
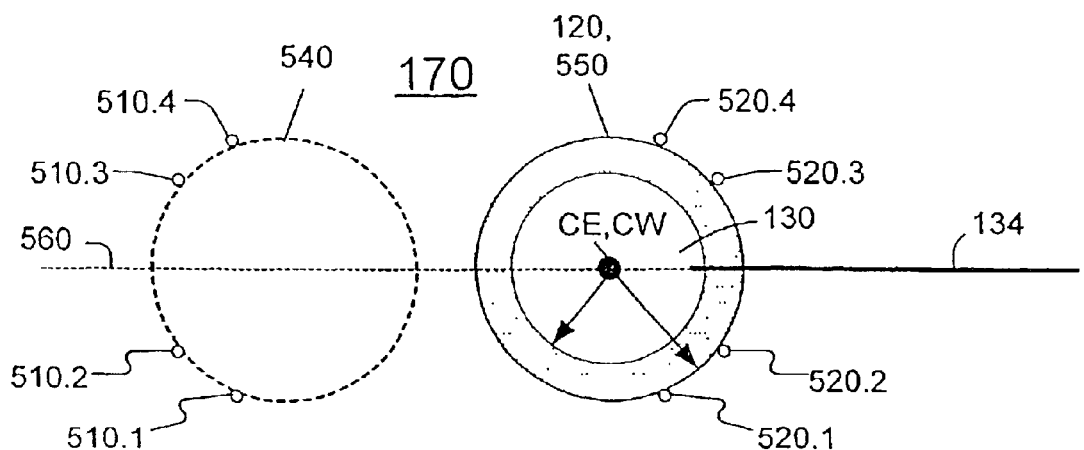

At station 170, the wafer is moved in the end effector to cause the center of the wafer to coincide with the center of the end effector (we will refer to this stage as "XY positioning"). Then the wafer is rotated in the end effector to align the wafer rotationally. The XY positioning involves techniques similar to those described in U.S. patent application Ser. No. 09/904,700, entitled "Article Holders and Article Positioning Methods", filed by A. J. Berger and F. E. Kretz on Jul. 13, 2001 and incorporated herein by reference. The XY positioning involves the robot pushing the wafer against an object or objects. The wafer slides on pads 340 without the end effector losing hold of the wafer. One embodiment is illustrated in FIGS. 6–9. FIG. 6 is a perspective view, and FIGS. 7–9 are top views. Here the objects against which the wafer is pushed are two sets of vertical pins. One set of pins consists of pins 510.1, 510.2, 510.3, 510.4 ("pins 510"). The other set consists of pins 520.1, 520.2, 520.3, 520.4 ("pins 520"). Pins 510, 520 are mounted on a support plate 530. Pins 510 are positioned along a circle 540 (FIG. 7) of the same radius as wafer 120. Pins 520 are positioned along a circle 550 of the same radius as wafer 120. Pins 510.1, 510.2 are symmetric to pins 510.4, 510.3 with respect to a horizontal axis 560. Pins 520.1, 520.2 are symmetric to pins 520.4, 520.3 with respect to the same axis 560.

If wafers may have notches or flats, the pins are positioned so that any two of the pins are farther apart than the maximum lateral dimension of the notch or flat. (This is just an exemplary implementation which does not limit the invention. In other embodiments, the pins may be positioned closer to each other than the length of a flat for example.)

As shown in FIGS. 6, 7, the end effector brings the wafer 120 to station 170 with the wafer above the pins 510, 520, and the end effector lowers the wafer so that the wafer is positioned between the pins, without touching the pins. The end effector's center CE is positioned at a predetermined point on axis 560. The wafer's center CW may be shifted relative to the end effector's center CE due to a positioning error. The maximum error is determined by a particular application, and may be a function of maximum positioning errors at source station 121. We will assume, for the sake of illustration, that the maximum positioning error Emax of the wafer in the end effector at the stage of FIG. 6, i.e. the maximum distance between the centers CE and CW, is 1.25 mm. The wafer is positioned so that it does not touch the pins 510, 520 when the error is not more than 1.25 mm.

As shown in FIG. 8, the end effector moves to the left along axis 560 to bring the wafer in contact with pins 510. The pins push the wafer into the circle 540. The wafer slides on the end effector pads 310 and changes its position relative to the end effector until the wafer position coincides with circle 540. In this position, the wafer contacts all of pins 510, or it may contact three of pins 510 with the forth pin being against the wafer's notch or flat. To insure that the wafer becomes positioned in circle 540, the center CE of the end effector is moved to the left of the center of circle 540 by the distance Emax=1.25 mm or more, for example, 25 to 51 mm. (In FIG. 7, the center of circle 540 coincides with the center CW of wafer 120.)

As shown in FIG. 9, the end effector now moves to the right along axis 560. The end effector's center CE moves along the axis into the center of circle 550. Wafer 120 comes in contact with at least three of pins 520. Pins 520 steer the wafer into circle 550 as the wafer slides on pads 310. Now the wafer's center CW coincides with the end effector's center CE.

Figure 10:
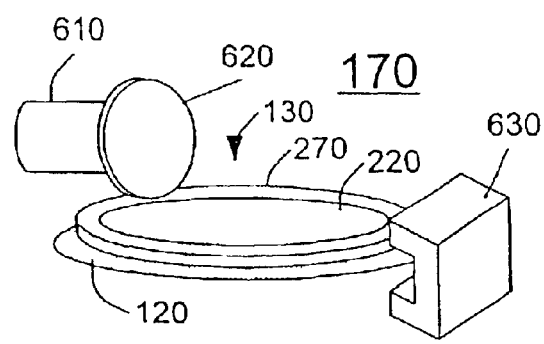
FIG. 10 is a perspective view illustrating an alignment operation according to one embodiment of the present invention.

As shown in FIG. 10, station 170 also includes a motor 610 (e.g. a computer controlled stepper or servo motor) which rotates a wheel 620. After the stage of FIG. 9, the end effector moves into a position in which an edge of wheel 620 physically contacts the top surface of the ring's horizontal portion 270H, causing the ring to rotate. A sensor 630 scans the edge of the rotating wafer 120 and provides signals to the computer (not shown) controlling the motor 610. The signals indicate whether the sensor has detected a notch, a flat, or some other alignment mark on the wafer. Responding to these signals, the computer controls the motor 610 to position the wafer into a desired rotational orientation relative to the end effector. Suitable sensors and motor control algorithms are described, for example, in U.S. Pat. No. 6,164,894 (issued Dec. 26, 2000), U.S. Pat. No. 5,456,179 (issued Aug. 13, 1996), U.S. Pat. No. 5,452,078 (issued Sep. 19, 1995), all incorporated herein by reference.

When the alignment has been completed, the end effector places the wafer on destination station 122 (FIG. 1).

The invention is not limited to any particular number of pins 510, 520, or their positioning. The pins do not have to be positioned symmetrically with respect to any axis. Also, article 120 and end effector 130 do not have to be round or symmetric. The pins can be replaced by other objects, vertical or otherwise, as described in the aforementioned U.S. patent application Ser. No. 09/904,700. Either pins 510 or pins 520 can be omitted in some embodiments. The invention is not limited to any particular positioning of pins 510, 520, motor 610 or sensor 630 relative to each other. The sensor may be positioned close to the motor, below the motor for example.

In some embodiments, the XY positioning operations of FIGS. 6–9 are omitted if the XY positioning errors are within the allowable tolerances.

The invention is not limited to any particular alignment mechanism at station 170. For example, motor 610 can be coupled to end effector 130 using some other coupling means than wheel 620. Sensor 630 may be a through-beam type, a retroreflective type, a CCD camera, or some other type, known or to be invented.

In some embodiments, station 170 is part of robot 124 or destination station 122. For example, sensor 630, motor 610, and/or wheel 620 can be attached to the end effector or some other part of the robot.

Spring steel plates 310 allow ring 270 and wafer 120 to move up relative to end effector body 220 if the end effector presses the wafer against some surface at station 122. The surface may be that of a sticky tape, e.g. a dicing tape. See the aforementioned U.S. patent application Ser. No. 09/632,236 filed Aug. 4, 2000 by S. Casarotti et al., entitled "Detection and Handling of Semiconductor Wafers and Wafer-Like Objects", incorporated herein by reference. Spring steel plates 310 allow the ring and the wafer to yield when the wafer is pressed against the surface, so wafer damage is avoided. The invention is not limited to any particular number or position of plates 310 Plates 310 can be made of a material other than spring steel, or can be omitted.

The invention is not limited to any particular structures or materials. For example, strips 280 (FIG. 4) can be made of something other than Teflon, or may be omitted or replaced with other friction reducing devices (e.g. bearings). Outward protrusions 330 on ring 270 can be omitted. Pads 340 can be positioned elsewhere on the ring's bottom surface. The invention is not limited to the presence of shelf 260 in the end effector's body, or to any particular shape of the end effector, or any particular coupling between the end effector body 220 and ring 270. Ring 270 may be replaced with some other rotational member, for example, a half-ring or a number of rotational arms extending from arm 134. The ring or other member need not surround the body 220. The ring may be positioned under the body. In some embodiments, ring 270 is omitted. The entire end effector 130 is rotatable on arm 134 around a vertical axis passing through the end effector and/or the center of the wafer. The end effector may be a non-vortex type. For example, the end effector may hold the wafer with a non-vortex gas flow using the Bernoulli effect. The end effector may be of a vacuum type. If the end effector has a rotatable ring 270, gas inlets for creating the vacuum may be located on the bottom of ring 270. The end effector may also hold the wafer with electrostatic or magnetic forces, with a mechanical clamp, or by other means, known or to be invented. The wafer may be positioned above the end effector. Non-horizontal positioning of the wafer and the end effector is within the scope of the invention.

The invention is not limited to semiconductor wafers. Article 120 may be include a stack of wafers bonded together to provide vertical integrated circuits. See U.S. Pat. Ser. No. 6,184,060 issued Feb. 6, 2001 to O. Siniaguine and incorporated herein by reference. The article may include a combination of semiconductor and non-semiconductor wafers. See U.S. patent application Ser. No. 09/791,977 filed on Feb. 22, 2001 by O. Siniaguine and incorporated herein by reference. In other embodiments, the article is a flat-panel display or some other type extending generally along a plane.

The invention is not limited to end effector article holders. Holder 130 may be a hand-held article holder. A human operator may align the wafer in the end effector by pushing and rotating the wafer with the operator's hand. The operator's hand may push the wafer or the ring 270 or both. Holder 130 may also be part of non-electronically-controlled equipment. Other embodiments and variations are within the scope of the ion, as defined by the appended claims.

What is claimed is:

1. An article alignment method comprising:
   transporting an article holder, with an article held by the holder, to a rotary drive; and
   coupling the rotary drive to the article holder to rotate at least a portion of the article holder around an axis passing inside the article so as to rotate the article relative to the article holder while the holder is holding the article;
   wherein coupling the drive to the article holder comprises coupling the drive to a rotational member of the article holder, the rotational member physically contacting the article and coupling the rotary motion of the drive to the article
   wherein the rotational member is rotated by the rotary drive around said axis which is stationary relative to a body of the holder, the rotational member rotating relative to the body when the rotational member rotates around said axis, the rotational member contacting and rotating the article around said axis, the article rotating relative to the body.

2. The method of claim 1 wherein holding the article comprises pressing the article against the holder; and
   rotating at least a portion of the article holder comprises rotating at least a portion against which the article is pressed.

3. The method of claim 2 wherein the article holder comprises one or more openings through which one or more gas flows are emitted towards the article to attract the article to the holder; and
   the article is pressed against one or more protrusions on the holder.

4. An article alignment method comprising:
   holding an article with an article holder; and
   rotating at least a portion of the article holder around an axis passing through the article to rotate the article relative to the article holder while the holder is holding the article;
   wherein holding the article comprises pressing the article against the holder; and
   rotating at least a portion of the article holder comprises rotating at least a portion against which the article is pressed;
   wherein the article is pressed against one or more protrusions on the holder; and
   the method further comprises pushing the article against one or more objects to cause the article to slide on the one or more protrusions while the holder is holding the article.

5. A computer system programmed to control an article holder and a motor for rotating at least a portion of the article holder to perform the operations of claim 1.

6. A computer readable medium comprising computer instructions to control an article holder and a motor for rotating at least a portion of the article holder to perform the operations of claim 1.

7. The method of claim 1 wherein the article rotation relative to the article holder places the article into a predetermined rotational orientation.

8. The method of claim 7 further comprising sensing a rotational orientation of the article with a sensor when the article is rotated.

9. The method of claim 1 wherein the rotary drive comprises a motor.

10. The method of claim 1 further comprising, after rotating the article, transporting the article holder, with the article held by the holder, away from the rotary drive.

11. The method of claim 10 wherein after rotating the article, the article holder is transported to a destination station and the article is released from the holder and placed at the destination station.

12. An article alignment method comprising:
   holding an article by an end effector operable to transport articles between different stations, the end effector holding the article as the article is being transported between different stations, the end effector comprising a body and a rotational member which contacts the article;

rotating the rotational member around a first axis which is stationary relative to the body, the rotational member rotating relative to the body when the rotational member rotates around the first axis, the rotational member contacting and rotating the article held by the end effector around the first axis, the article rotating relative to the body.

13. The method of claim 12 wherein the end effector holds the article without the body contacting the article.

14. The method of claim 12 wherein the first axis passes inside the article.

15. The method of claim 12 wherein the first axis passes inside the rotational member.

16. The method of claim 15 wherein the rotational member is rotated by a rotary drive coupled to the rotational member, and the method further comprises transporting the end effector to the rotary drive while the article is held by the end effector.

17. The method of claim 16 further comprising, after rotating the article, transporting the end effector, with the article held by the end effector, away from the rotary drive.

18. The method of claim 16 wherein the end effector is transported away from the rotary drive to a destination station, and the article is released from the end effector and placed at the destination station.

19. The method of claim 16 wherein the article rotation relative to the body places the article into a predetermined rotational orientation.

20. The method of claim 19 further comprising sensing a rotational orientation of the article with a sensor when the article rotates.

21. The method of claim 16 wherein the rotary drive comprises a motor.

22. The method of claim 12 wherein holding the article by the end effector comprises emitting one or more gas vortices from the body towards the article to draw the article towards the body.

* * * * *